Figure 1:
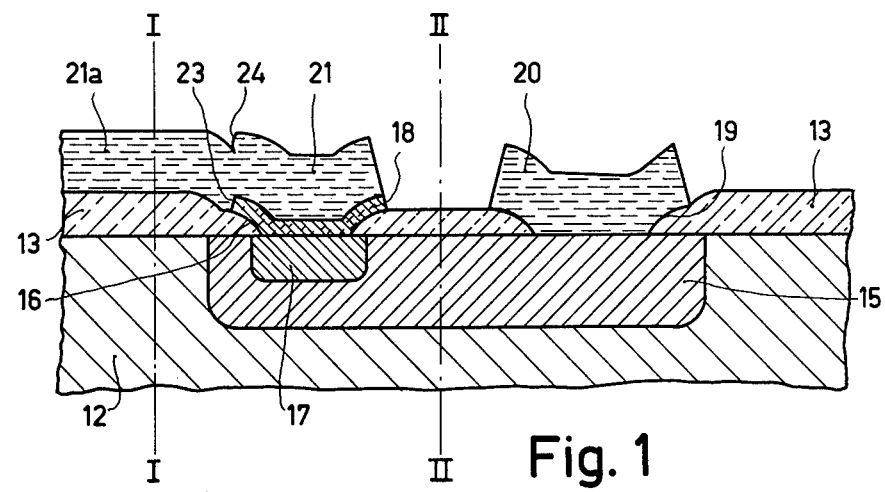

United States Patent [19]
De Brébisson

[11] 4,124,934
[45] Nov. 14, 1978

[54] MANUFACTURE OF SEMICONDUCTOR DEVICES IN WHICH A DOPING IMPURITY IS DIFFUSED FROM A POLYCRYSTALLINE SEMICONDUCTOR LAYER INTO AN UNDERLYING MONOCRYSTALLINE SEMICONDUCTOR MATERIAL, AND SEMICONDUCTOR DEVICES THUS MANUFACTURED

[75] Inventor: Michel Dé Brebisson, Caen, France
[73] Assignee: U.S. Philips Corporation, New York, N.Y.
[21] Appl. No.: 764,591
[22] Filed: Feb. 1, 1977
[30] Foreign Application Priority Data
Feb. 4, 1976 [FR] France .................................. 76 03093
[51] Int. Cl.² ............................................. B01J 17/00
[52] U.S. Cl. .................................... 29/590; 29/591; 148/188; 357/59
[58] Field of Search .................... 29/589, 590, 591; 357/59; 148/188

[56] References Cited
U.S. PATENT DOCUMENTS

| 3,664,896 | 5/1972 | Ducan | 357/59 |
| 3,864,217 | 2/1975 | Takahata | 29/590 |
| 3,912,557 | 10/1975 | Hochberg | 357/29 |
| 3,918,149 | 11/1975 | Roberts | 29/590 |
| 3,935,635 | 2/1976 | Botzenhardt | 29/590 |

Primary Examiner—W. Tupman
Attorney, Agent, or Firm—Frank R. Trifari

[57] ABSTRACT

A method of manufacturing a semiconductor device in which a layer of polycrystalline material having a high impurity concentration is used prior to the diffusion of a thin region having strong surface concentration and prior to providing a contact to the said region.

The polycrystalline layer is comparatively thick prior to the diffusion and is reduced in thickness before the metal contact is provided.

25 Claims, 9 Drawing Figures a b c d a b c d

MANUFACTURE OF SEMICONDUCTOR DEVICES IN WHICH A DOPING IMPURITY IS DIFFUSED FROM A POLYCRYSTALLINE SEMICONDUCTOR LAYER INTO AN UNDERLYING MONOCRYSTALLINE SEMICONDUCTOR MATERIAL, AND SEMICONDUCTOR DEVICES THUS MANUFACTURED

The invention relates to the manufacture of semiconductor devices in which doped semiconductor zones are formed in monocrystalline semiconductor material by local diffusion from doped polycrystalline semiconductor material.

It is known that during the manufacture of certain semiconductor devices of the planar kind, in particular semiconductor devices which comprise bipolar transistors for high frequencies, there are experienced technical difficulties which are caused mainly by the very small dimensions of the diffusion zones, in particular by the very small depth of the emitter-base junction and also of the base-collector junction. The particular difficulty in such an emitter zone of very small depth and small lateral dimensions, is to provide the zone with a contact without disturbing or short circuiting the p,n junction with the base zone. In order to mitigate these difficulties a method of manufacturing semiconductor devices is known in which at a major surface of a semiconductor body a protective insulating layer is provided on monocrystalline semiconductor material, in which insulation layer at least one window is present which gives access to the monocrystalline semiconductor material, a layer of polycrystalline semiconductor material which comprises a doping impurity is deposited on the major surface, the doping impurity at the area of the window or the windows is diffused from the polycrystalline semiconductor material into the monocrystalline semiconductor material so that one or more semiconductor zones doped with the diffused impurity are formed in the monocrystalline semiconductor material, and the semiconductor zone or zones are provided with an ohmic contact by means of a metal layer which is provided on the polycrystalline material in the window and windows, respectively. In this method a layer of polycrystalline silicon with a strong concentration of doping impurity is deposited on a slice of monocrystalline silicon which has been subjected already to several treatments for the manufacture of transistors of the planar type up to the stage in which after the diffusion of the bases apertures are provided in the protective layer corresponding to the zones destined for the emitters. The impurity is diffused locally in the monocrystalline material of the slice from the polycrystalline layer via the apertures. For providing an emitter contact an aluminium layer may be provided directly on the polycrystalline layer in the window. Upon forming said aluminium contact, interaction takes place between the aluminium and the polycrystalline semiconductor material but the diffusion zone formed in the monocrystalline material is not attacked.

The invention is based on the recognition that the above-described use of a polycrystalline semiconductor layer may also involve difficulties apart from the above-described advantages. Polycrystalline semiconductor material, also with a very high concentration of doped impurities, still has a considerably higher resistivity than metals conventionally used for contacting, for example aluminium. As a result of this a small increase of the emitter series resistance may occur while in general it is sought to minimize said emitter-series resistance.

The layer of doped polycrystalline semiconductor material which is deposited on the major surface will in general not be useful everywhere in the finished semiconductor device or may even be undesired locally. It will therefore generally be necessary to restrict the polycrystalline semiconductor layer to certain parts of the major surface, for which purpose it will be necessary to give the layer a certain pattern, for example by means of a conventional photo-etching process. The edges of the pattern of the polycrystalline layer formed in the process constitute comparatively abrupt differences in height on the resulting major surface. It is known that such abrupt differences in height may give undesired discontinuities in further layers still to be provided on the major surface. In the present case the danger exists that such a discontinuity occurs in the metal layer to be provided, which may present difficulties in interconnecting the emitter.

One of the objects of the invention is to mitigate these drawbacks. The invention which relates to a method of manufacturing semiconductor devices in which a protective insulating layer is provided on monocrystalline semiconductor material at a major surface of the semiconductor body, such layer having therein at least one window which provides access to the monocrystalline semiconductor material. A layer of polycrystalline semiconductor material which comprises a doping impurity is deposited on the major surface of the body, the doping impurity at the area of the window or the windows is diffused from the polycrystalline semiconductor material in the monocrystalline semiconductor material so that one or more semiconductor zones doped with the diffused impurity are formed in the monocrystalline semiconductor material, and the resulting semiconductor zone or zones are provided with an ohmic contact by means of a metal layer which is provided on the polycrystalline material in the window and the windows, respectively, is inter alia based on the following considerations.

The influence of the polycrystalline layer between the metal layer and the emitter formed by diffusion, on the emitter-series resistance and undesired discontinuities on further layers provided on the major surface, for example the metal layer, can be reduced by choosing the polycrystalline layer to be sufficiently thin. On the other hand, however, the polycrystalline layer during the diffusion process must form the container of the doping impurity which is to be diffused in the underlying monocrystalline semiconductor material to form the doped zone. In particular when a high concentration of doping impurity is desired in the doped zone to be formed, for example, to serve as an emitter of a bipolar transistor, and furthermore a high surface concentration of the zone is desired for a good contact, the concentration of the doping impurity in the polycrystalline layer should not be reduced too considerably by the diffusion. For this purpose the provided doped polycrystalline layer, however, should have a sufficient thickness. The invention is therefore based on the principle to provide the doped polycrystalline layer a sufficient thickness in for the formation of the diffused zone, but to reduce the thickness afterwards to a sufficient extent.

The above-mentioned method of manufacturing semiconductor devices, according to a first embodiment of the invention is characterized in that the thickness of the doped polycrystalline semiconductor layer is reduced after the diffusion process and prior to the provision of the metal layer.

According to a second embodiment of the invention the said above-mentioned method of manufacturing semiconductor devices is characterized in that, at least prior to the provision of the metal layer, the layer of polycrystalline semiconductor material is given a desired pattern, which covers only part of the major surface of the semiconductor body and which covers entirely the portions of the monocrystalline semiconductor material exposed in the window and in each of the windows, respectively, and that the thickness of the polycrystalline semiconductor layer is reduced to a remaining thickness corresponding with a thickness smaller than one fifth of the thickness of the metal layer to be provided.

The invention further relates to semiconductor devices manufactured by using any method according to the invention.

It is to be noted that in the above-described known process an oxidizing atmosphere may be used in known manner during the diffusion process in which the polycrystalline material is oxidized over a part of the layer thickness. The advantage of this known embodiment when used with arsenic-doped or phosphorus-doped polycrystalline silicon as a diffusion source for doping underlying monocrystalline silicon is that the formed silicon oxide impedes evaporation of the dopings, in which even a stowing effect in the polycrystalline silicon may occur in that the impurities are expelled by the silicon oxide being formed. However, the degree of reduction of the original thickness of the polycrystalline layer with this oxidizing effect depends on the temperature and time chosen for the diffusion. This known diffusion in an oxidizing atmosphere associated with a certain reduction in thickness of the doped polycrystalline layer may also be used in the methods according to the invention. In the first embodiment this results in a further decrease of the thickness after the diffusion treatment. In the second embodiment the reduction in thickness of the polycrystalline layer may be restricted, if possible, to the decrease in thickness during the diffusion process if the original thickness of the polycrystalline layer is not chosen to be too thick.

It may be desirable to restrict the polycrystalline layer approximately to the window or windows, respectively. In order to prevent in such cases that a part of the monocrystalline semiconductor surface will directly contact the metal layer, according to a preferred embodiment the polycrystalline semiconductor layer is restricted to one or more parts which overlaps the window and which each overlap one of the windows, respectively, and projects laterally over the edge of the associated window. Due to the fact that the thickness of the semiconductor layer has been made small, an abrupt difference in height at the edge of the relevant part at the polycrystalline layer can also be kept small so that the possibility of a possible detrimental influence on the metal contact layer is reduced.

When after the provision of the metal layer one or more further layers have to be provided on the major surface, defects or discontinuities may also occur as a result of an abrupt difference in height in an underlying structure of layers, even when such a further layer is not provided directly on the underlying structure of layers. In particularly the case of a multilayer wiring system, conductive connections can be interrupted in one or more of the wiring layers by discontinuities, or defects may occur in an insulation layer separating two successive wiring layers, so that undesired short-circuiting connections may be formed. In order to reduce the possibility of such undesired phenomena in such a case, according to a preferred embodiment the thickness of the polycrystalline semiconductor layer is reduced, prior to the provision of the metal layer, to a value smaller than one fifth part of the thickness of such a further layer to be provided or smaller than one fifth part of the thickness of the thinnest of the further layers to be provided.

As already stated above, the invention is of particular importance to form highly doped zones and/or zones of high surface concentration in monocrystalline semiconductor material. It is desired to incorporate a high concentration of doping impurities in the polycrystalline layer. For this purpose, according to a preferred embodiment the depositing polycrystalline semiconductor material is saturated or substantially saturated with the doping impurity. The term "substantially saturated" should be considered in connection with comparatively wide margins in concentrations of doping impurities permissible in semiconductor technology, in which it is usual inter alia for indicating the concentrations of an impurity in successive places in a semiconductor body to plot said concentrations on a logarithmic scale. In the present case, therefore, a concentration of one tenth part of the saturation concentration may still be considered as "substantially saturated."

The doped polycrystalline layer is preferably provided in a thickness which is sufficient to ensure that during the diffusion treatment at the area of the window (windows) the store of doping impurity in the polycrystalline layer does not deteriorate too much. In this manner, inter alia a desired high surface concentration can be maintained in the forming diffusion zone until the end of the diffusion process. According to a preferred embodiment the thickness is chosen to be so that during the diffusion treatment the quantity of the doping impurity in the polycrystalline layer at the area of the window and the windows, respectively, decreases by at most three fourths part, so that at the end of the diffusion treatment at least one fourth part of the original quantity of the doping impurity remains in the polycrystalline material.

As already explained above in connection with the present invention, the reduction in thickness of the polycrystalline layer prior to providing the metal contact layer and possible further layers is of advantage. However, as is already known, the polycrystalline layer in itself should be maintained at the area of the window and windows, respectively, for protection of the underlying formed diffusion zone(s) against attack by the metal. According to a preferred embodiment, for this purpose the thickness of the polycrystalline layer is reduced to a value which is 1 to 10 times the thickness of the part of the semiconductor material which is dissolved in the metal layer upon forming the ohmic contact.

It is to be noted that for the provision of contacts on planar semiconductor devices, in particular in which shallow diffusion zones are used, in practice metals will preferably be chosen which are capable of forming good ohmic contacts at temperatures below possible eutectic temperatures of semiconductor material and metal, so that the semiconductor material can at most enter in solid solution in the metal as in the case of an aluminium contact layer on silicon. As a result of this the depth of penetration of the metal in the polycrystalline layer remains small. For practical applications, the thickness of the polycrystalline semiconductor layer in most of the cases can be reduced to values between 0.03 and 0.2 μm, preferably between 0.05 and 0.15 μm. It has been found that these values also give good satisfaction when using doped polycrystalline silicon and an aluminium contact layer.

The invention will now be described in greater detail with reference to the accompanying drawings, in which FIG. 1 is a diagrammatic cross-sectional view of a part of a transistor as it can be manufactured by means of a method according to the invention, FIGS. 2a, 2b, 2c and 2d are diagrammatic cross-sectional views of a detail of stages in the manufacture of a transistor of a type as shown in FIG. 1 while using an embodiment of a method according to the invention, FIGS. 3a, 3b, 3c and 3d are diagrammatic cross-sectional views of a detail of stages in the manufacture of a type as shown in FIG. 1 while using another embodiment of a method according to the invention.

It is to be noted for reasons of clarity the parts in the figures are not drawn to scale and that especially the thicknesses of the parts are strongly exaggerated.

FIG. 1 shows a transistor of the planar type as it can be obtained by means of embodiments of methods according to the invention. This transistor is, for example, a component of an integrated circuit.

A monocrystalline region 12 is situated at a major surface of a disk consisting of semiconductor single crystal. The region 12 is, for example, an epitaxial layer. At the major surface this region is covered with a protective layer 13 of insulating material. The semiconductor single crystal consists of silicon in this case. This region 12 forms, at least partly, the collector of the transistor.

A base zone 15, the conductivity type of which is opposite to that of the region 12, is obtained by a known diffusion process in an oxidizing atmosphere with local diffusion via an aperture in a protective layer provided at the major surface, which aperture is formed by a photo-etching process. During the diffusion an oxide layer has been formed in the aperture in the window so that the protective layer extends throughout the major surface. In the protective layer 13 and above the base region 15 an aperture 16 is provided through which an emitter zone 17 is diffused by means of a polycrystalline layer of semiconductor material which is rich in doping impurities, the polycrystalline doping layer being the source of the impurity. The impurity is chosen to give the emitter zone the conductivity type which is opposite to that of the base zone, that is the same conductivity type as the region 12 of the monocrystalline disk.

The polycrystalline layer 23 on the transistor of FIG. 1 is shown in a later stage of the method after the layer 23 has been made thinner. Furthermore the polycrystalline layer 23 has been restricted to one or more parts by photoetching, as the island 18 shown in FIG. 1.

In the protective layer 13 and above the base zone 15 another aperture 19 is provided via which the base zone 15 can be contacted. At least one metal layer is deposited on the major surface and shaped to the desired pattern with one or more contact faces by means of a photoetching process.

FIG. 1 shows a contact face 20 with the base zone and a contact face 21 with the emitter zone. The contact face 21 is in ohmic connection with the emitter 17 via the polycrystalline island 18. An elongation 21a of the contact face 21 is provided on the protective layer 13, as is usual in an integrated circuit to connect the emitter of the transistor electrically to another element of the circuit. In the case of a discrete transistor the contact face 21 also comprises generally such an elongation which enables the electrical interconnection of several narrow and parallel emitter zones 17 and the easy soldering of a connection wire to a common connection place. Where the contact face 21 changes into the elongation 21a the metal covers the abrupt edge 23 of the polycrystalline island 18. At the surface of the metal layer a difference in height also occurs above this edge 23 with a discontinuity 24.

The polycrystalline semiconductor layer has been made thinner, the remaining thickness of the polycrystalline layer 18 being still sufficient to ensure that the polycrystalline layer of the island 18 effectively protects the emitter region 17 against the penetration of metal of the contact face 21. However, the remaining thickness of the semiconductor layer is smaller than one fifth of the thickness of the metal of the contact face 21, so that the effect of the discontinuity 24, added to that of the difference in height of the edge 23 of the polycrystalline island, does not noteworthily affect the quality of the electrical connection between the face 21 and the elongation 21a.

The manufacture of transistor structures as shown diagrammatically in FIG. 1 will now be described with reference to two examples, namely a first example with reference to FIGS. 2a to 2d and a further example with reference to FIGS. 3a to 3d. These figures show details of various stages in the manufacture, such details corresponding to the part of FIG. 1 situated between the lines I—I and II—II.

According to the first example, the starting material is a disk of monocrystalline silicon of which an epitaxial layer 12 of the n-type is provided at a major surface in a thickness of 3 μm and a resistivity of approximately 0.7 ohm.cm. While using a 0.3 μm thick protective SiO$_2$ layer 13 with window, a p-type base zone 15, having a thickness of 0.8 μm, is formed in known manner by local diffusion of boron in an oxidizing atmosphere. The formed protective layer 13 is covered in known manner with a 0.1 μm thick silicon nitride layer (not shown).

An aperture 16, which gives access to a surface part of the base zone 15 of the transistor to be manufactured, is made in known manner in the protective layer 13. The aperture 16 has the desired shape of the emitter of the transistor.

Figure 2:
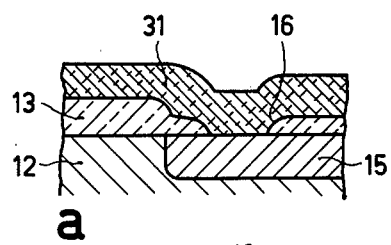
Figure 2:
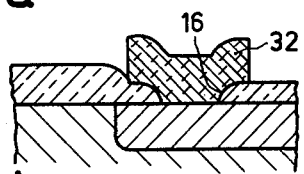
Figure 2:
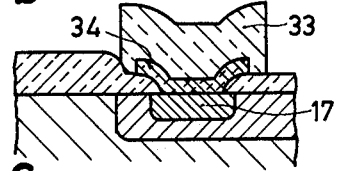
Figure 2:
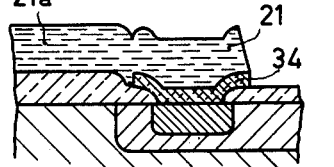

In known manner a polycrystalline layer 31 is then formed on the major surface by deposition of silicon at a temperature of approximately 650° C. by thermal decomposition of silane (SiH$_4$) to which 0.003 parts by volume of arsenic hydride (AsH$_3$) per part by volume of SiH$_4$ has been added. During the deposition a strong concentration of arsenic between approximately $4 \times 10^{20}$ and $7 \times 10^{20}$ atoms per cm$^{-3}$ is obtained (resistivity on the order of 0.001 ohm cm), which concentration is a factor of less than 10 smaller than the maximum solubility (approximately $3 \times 10^{21}$ at.cm$^{-3}$) at the deposition temperature. The polycrystalline silicon layer comprises between approximately $1.5 \times 10^{16}$ and $3 \times 10^{16}$ atoms per cm$^2$ of said layer. The layer 31 is deposited in a thickness of approximately 0.4 μm. The resulting stage is shown in FIG. 2a.

The polycrystalline silicon layer 31 is then restricted by means of a photoetching process, for example while using an etching solution for silicon on the basis of hydrofluoric acid, nitric acid to a pattern with the island 32 which overlaps the aperture 16 (see FIG. 2b) and acetic acid.

It is to be noted that the thickness of the polycrystalline layer 32 in this stage is rather large, which permits obtaining afterwards an emitter zone having a high surface concentration of the indiffused impurity, in particular when the polycrystalline layer 32 which serves as an impurity source has retained after the diffusion at least the fourth part of the original quantity of impurity which initially was present in the layer prior to the diffusion. For that purpose the thickness of the polycrystalline layers 31 and 32 is preferably chosen to be larger than 1/5 of the diffusion depth of the emitter zone.

The diffusion is carried out by heating the disk in an oxygen atmosphere saturated with water vapour, at 85° C. for 1 hour at a temperature of 1000° C. The formed emitter zone 17 (see FIG. 2c) has a thickness of approximately 0.3 $\mu$m and a surface concentration between $1 \times 10^{20}$ and $2 \times 10^{20}$ at.cm$^{-3}$. By oxidation of polycrystalline silicon an oxide layer 33 is formed in a thickness of 0.6 $\mu$m. Taking into account the increase of the volume of material which occurs during the oxidation of silicon, the reduction of the thickness of the layer as a result of the oxidation is 0.27 $\mu$m, so that a 0.13 $\mu$m thick layer of polycrystalline silicon 34 remains. Since during the oxidation the arsenic is expelled from the forming oxide, the concentration in the remaining polycrystalline silicon is increased to $5 \times 10^{20}$ to $10 \times 10^{20}$ at.cm$^{31}$ 3, which corresponds to a remaining quantity of approximately $0.7 \times 10^{16}$ to $1.5 \times 10^{16}$ atoms per cm$^2$ in the polycrystalline silicon layer 34, that is slightly less than half the original quantity.

The oxide layer 33 formed is now removed in known manner by dissolving in hydrofluoric acid. As a result of the presence of the above-mentioned silicon nitride layer on the oxide of the protective insulating layer 13 it is prevented that such layer is also etched away. Where further apertures have to be provided in the insulating layer 13 for contact to other semiconductor zones, the nitride may previously be removed at those areas, so that said further apertures are formed in the layer 13 during the etching away of the oxide layer 33.

The metal contact layer is then provided and given a desired pattern in known manner with the contact face 21 of the polycrystalline silicon island 34 and adjoining part 21a of the metal layer for interconnecting the emitter (see FIG. 2d). For this purpose, an aluminium layer is provided in known manner by evaporating in a vacuum in a thickness of 0.08 $\mu$m, which layer is then given the above-mentioned pattern by means of a known photoetching process.

The thickness of the remaining part 34 of the island of polycrystalline silicon has been reduced so that it is smaller than 1/5 of the thickness of the metal layer from which the contact face 21 and the elongation 21a are formed, so that there is negligble possibility that the difference in height in the substratum of the aluminium layer at the edge of the island 34 in said metal layer causes a considerable discontinuity.

On the other hand it is useful to maintain a sufficient protection of the emitter-base junction against a dissolving effect of the metal of the contact face 21 on the semiconductor material of the emitter zone during heating of the disk to improve the electrical properties of the contacts, and/or possibly during subsequent processes, for example in assembling the resulting semiconductor device. It is favourable to maintain the remaining part 34 of the island at a thickness which is between one and ten times that which actually is dissolved by the metal of the contact face. The thickness which is dissolved has proved to be much larger, at least locally, than can be derived theoretically from investigations of the phase diagram of the binary system of silicon and the relevant metal, in this case aluminium. For good contact heating is carried out for 15 to 30 minutes, for example at a temperature between 450° C. and 500° C. after providing the aluminium layer. It has been found that the thickness of the dissolved part of the polycrystalline material can locally be 0.015 to 0.04 $\mu$m, which thicknesses are smaller than the thickness of the polycrystalline layer 34 (0.13 $\mu$m) but larger than one tenth of the last-mentioned thickness.

FIGS. 2a to 2d describe an example of the method according to the second embodiment of the invention for the manufacture of a transistor having one metal layer on a single level. However, the invention is not restricted to this example and more generally also relates to semiconductor devices having a p,n junction of a type as described in the preamble and for which a thin diffused zone is used having a strong surface concentration. It is preferably used in integrated circuits having high integration density in which metal connections are realized at different levels (so-called multi-layer wiring). A better quality of the product and a higher yield can still be obtained if, according to a preferred embodiment, the thickness of the remaining part of the polycrystalline layer 34 after reduction in thickness is smaller than one fifth of the thinnest extra layer which is provided on the major surface after the metal contact layer.

Furthermore, details described in the above-mentioned embodiment may be varied without departing from the scope of this invention. In particular, other doping impurities may be used in the polycrystalline layer, for example phosphorus, or acceptor impurities, in particular boron, for applications in which a p-type zone should be formed by diffusion.

In the gas mixture for depositing phorphorous-doped polycrystalline silicon are used, for example, 0.003 parts by volume of PH$_3$ per part by volume of SiH$_4$, said silicon obtaining a resistivity in the order of 0.001 ohm.cm. In the case of boron, for example, 0.005 parts by volume of B$_2$H$_6$ are used per part by volume of SiH$_4$, the silicon obtaining a resistivity in the order of 0.005 ohm.cm.

The initial thickness of the polycrystalline layer as it is deposited generally proves to be sufficient when said thickness is between 0.2 and 0.8 $\mu$m and preferably is between 0.2 and 0.5 $\mu$m. After partial removal the thickness of the remaining part of the layer may be between 0.03 and 0.2 $\mu$m and preferably between 0.05 and 0.15 $\mu$m. The thickness of the aluminium layer used for the contact is preferably between 0.7 and 1.5 $\mu$m.

In the preceding example, only the oxidation during the thermal diffusion treatment is used for reducing the thickness of the polycrystalline layer. If desired the thermal diffusion treatment may be carried out in various steps between which the formed oxide layer is removed. As a result of this, the thickness of the polycrystalline layer can be reduced considerably with an equal total diffusion time, the non-linear character of the growth of the oxide as a function of the oxidation time being taken into account. The quantity of material which is removed per oxidation treatment may also be reduced, if desired, by varying the oxidation capacity of the atmosphere in which the diffusion is carried out, for example, by decreasing the humidity of the oxygen in the diffusion space or by successively varying during the diffusion treatment the composition of the gas atmosphere.

Although the reduction in thickness of the polycrystalline layer during diffusion may lead to a satisfactory result, and the thickness of the removed part can be varied upon forming a diffusion zone of a given thickness, the coupling with the time and temperature to be chosen for the diffusion process remains a restriction for ultimately obtaining an optimum thickness. Both in the case in which already during the diffusion treatment a reduction of the thickness of the polycrystalline layer is obtained, and in the case that during said treatment such a thickness variation does not take place, the polycrystalline layer may be made thinner after the diffusion process according to the above-mentioned first embodiment of the invention. For this purpose a method of reducing the thickness may generally be chosen, in which temperatures are used which are sufficiently low in order that a noticeable diffusion of the doping impurity cannot occur, for example, in the case of silicon temperatures below 700° C., when the doping impurity is phosphorus or boron, and below 850° C. when the doping impurity is arsenic. Processes occurring, for example, at approximately room temperature, may be used for reducing the thickness.

According to a preferred embodiment, after the diffusion process electrolytic oxidation of the polycrystalline material may be used. This method is particularly suitable for use after diffusion to a very small depth, as will be explained hereinafter.

Reducing the thickness after the diffusion process may also be carried out by means of other processes, for example in known manner by partially etching the polycrystalline layer at a controllable speed in a slow-acting etchant. Etching may be carried out electrolytically which presents the advantage that an electrical control of the etching rate is possible, so that the quantity of removed material can be accurately controlled. The thickness of the layer may also be reduced in known manner by plasma etching in a dilute gas.

An example of a method according to the invention will now be described with reference to FIGS. 3a to 3d, in which the polycrystalline semiconductor layer, after the diffusion process, is reduced in thickness by electrolytic oxidation.

Figure 3:
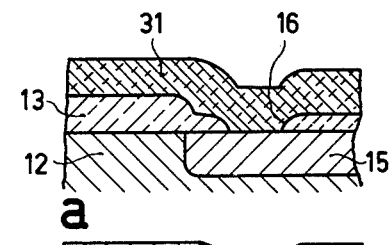
Figure 3:
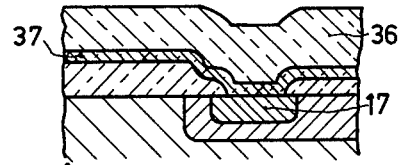
Figure 3:
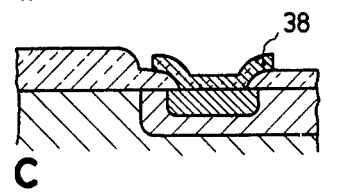
Figure 3:
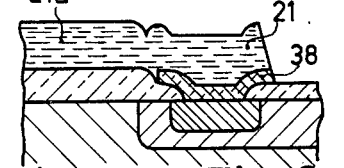

FIG. 3a show a stage in the manufacture of a part of a semiconductor device with transistor, which stage corresponds to the stage as is shown in the first example with reference to FIG. 2a. Starting material is a monocrystalline semiconductor disk (which in this example also consists of silicon) of which a region 12 situated at a major surface, of epitaxially provided silicon is provided with a base zone 25 of the transistor to be manufactured, and a protective layer 13 of insulating material having therein an aperture 26 above the base zone 15, which aperture has the desired shape of the emitter of the transistor. In the manner as described in the first example, a polycrystalline silicon layer 31 is deposited on the whole major surface of the disk, a high concentration of an impurity being incorporated in the said layer and giving the same conductivity type as that of the region 12.

A thermal diffusion treatment to manufacture the emitter zone is then carried out, namely prior to restricting the layer 31 to islands. A possibly formed oxide layer may then be removed in the manner as described in the preceding example. The thickness of the layer 31 may then be reduced by anodic oxidation in which the potential necessary for the oxidation can be applied across the layer across the whole major surface of the disk. It is known that the anodic oxidation of silicon can be carried out in a reproducible manner to obtain a thickness of the oxide layer 36 of 0.12 $\mu$m, after which said oxide layer may be dissolved, for example in hydrofluoric acid. The thickness of the polycrystalline layer has been reduced by 0.05 $\mu$m. Such a step consisting of such an oxidation succeeded by dissolving the formed oxide may then be repeated for any number of times as may be desired.

According to the present embodiment, there is started from a stage as shown in FIG. 3a which is even identical to and has been obtained in the same manner as the stage according to the first example which is shown in FIG. 2a, that is, a silicon disk having an n-type epitaxial layer 12, a diffused p-type base zone 15 and a protective insulation layer 13 of oxide having an aperture 16 for the emitter diffusion and a 0.4 $\mu$m thick polycrystalline silicon layer 31 having a high arsenic doping. In the present case, however, the silicon nitride layer on the protective layer 13 has been omitted. The diffusion process may be carried out in the same manner, in which the original thickness of the polycrystalline silicon layer has been reduced to 0.13 $\mu$m. The formed oxide layer is then dissolved, the polycrystalline silicon layer which in this case extends over the whole major surface protecting the underlying insulation layer 13 against the action of the solvent used.

The thickness of the polycrystalline layer may further be optimised without continuing the emitter diffusion. For this purpose an electrolyte bath consisting of 0.04 N solution of potassium-nitrate in ethylene glycol in which a little (traces of) water is (are) present is used for the above-mentioned electrolytic oxidation. The electrolyte bath is given a temperature of 40° C. The disk is oxidized anodically, a direct voltage source having an electromotive force of 80 V being used and the current being controlled so that at the beginning of the oxidation the current strength per cm$^2$ of surface area of the polycrystalline silicon layer is 10 mA. After a treatment of 10 minutes in which the current strength per cm$^2$ is reduced to less than 1 mA, the electrolysis is discontinued. The formed oxide layer 36 having a thickness of 0.12 $\mu$m is then dissolved solved in known manner, as described above. The remaining polycrystalline 37 only has a thickness of 0.08 $\mu$m. This small thickness is still amply sufficient to protect the shallow emitter zone against the action of the aluminium contact layer to be provided afterwards.

The result of the above-described processes is shown diagrammatically in FIG. 3b. The emitter zone 17 has been obtained by diffusion of the impurity from the polycrystalline layer. This layer is deposited in such a thickness that a high surface concentration of the emitter zone 17 is obtained. The polycrystalline layer has turned into an oxidized part 36 and into a diluted remaining polycrystalline layer 37 with the last-described electrolytic oxidation by conversion from the free surface thereof.

It is to be noted that the reduction in thickness of the polycrystalline layer before restricting same to islands, so that said layer still covers the major surface of the disk completely, is favourable for the selective dissolution of the oxide layer 36, since the remaining polycrystalline layer 37 protects underlying layers, such as the insulation layer 13, against the action of the solvent used.

The polycrystalline 37 which has been reduced in thickness is restricted to islands by means of a known photoetching process, for example the island 38 in FIG. 3c. The desired apertures are then made in the protective layer 13 by means of a photoetching process in the remaining contact places. An aluminium layer of approximately 1 µm thickness is provided and a conductor pattern with the desired contact is formed therein by means of a known photoetching process. The resulting phase is shown in FIG. 3d. The contact face 21 of aluminium is provided above the emitter and is connected thereto electrically via the island 38 of the polycrystalline layer. The contact face 21 is furthermore connected to the elongation 21a for interconnection, as already explained in the first example. The sharp edge of the island 38 has substantially no influence on the junction between the contact face 21 and the elongation 21a due to its small height.

The semiconductor device with transistor has been manufactured in this stage up to and including the provision with a first layer of metal connections. In the case of an integrated circuit it may be of importance to provide the semiconductor device with one or more extra connection layers at different level(s), in which no detrimental results are experienced from the sharp edge of the island 38 by the low thickness of the polycrystalline layer.

It is to be noted that the contact faces and wiring of the first level which in this case consists of aluminium may have a considerably larger thickness than the remaining polycrystalline layer, for example of the same order as that of the further layers. It is as a matter of fact known to pattern such an aluminium layer by chemically etching in such manner that edges are obtained which have a gentle slope and hence can be covered with further layers without causing discontinuities in said subsequent layers. As a result of this, aluminium layers may be used without predominant objections having a thickness between 0.7 and 1.5 µm to form the contact faces.

What is claimed is:

1. A method of manufacturing a semiconductor device, comprising the steps of:
   (a) providing a semiconductor body comprising a major surface and a monocrystalline semiconductor material located at said major surface,
   (b) providing a protective insulating layer on said monocrystalline material, said insulating layer having therein at least one window which gives access to said monocrystalline semiconductor material,
   (c) depositing at said major surface a layer of polycrystalline semiconductor material which comprises a doping impurity,
   (d) diffusing said doping impurity from said polycrystalline layer located at the area of said at least one window into said monocrystalline semiconductor material so that there is formed in said monocrystalline semiconductor material at least one semiconductor zone doped with said diffused impurity,
   (e) reducing the thickness of said doped polycrystalline semiconductor layer located in said window after the diffusion process and prior to providing a metal layer of an ohmic contact, and
   (f) providing said at least one semiconductor zone with an ohmic contact comprising a metal layer which is provided on said reduced polycrystalline material in said window.

2. A method as in claim 1, wherein polycrystalline semiconductor layer is restricted to at least one part which overlaps its associated respective window and laterally projects over the edge of said associated window.

3. A method as in claim 2, prior to providing said metal layer, the thickness of said polycrystalline semiconductor layer is reduced to a thickness smaller than one fifth of the thickness of a further layer to be provided and of the thinnest of further layers to be provided and further comprising the step of providing at least one such further layer.

4. A method as in claim 3, wherein at least one of said further layers consists of metal and is given a given pattern as a part of a multilayer wiring.

5. A method as in claim 3, wherein said polycrystalline semiconductor material is substantially saturated with said doping impurity.

6. A method as in claim 2, wherein said deposited polycrystalline semiconductor material consists essentially of doped silicon.

7. A method as in claim 2, wherein said monocrystalline semiconductor material located at said major surface of said semiconductor body is silicon.

8. A method as in claim 6, wherein said doping impurity in said polycrystalline semiconductor material is arsenic.

9. A method as in claim 6, wherein said doping impurity in said polycrystalline semiconductor material is phosphorus.

10. A method as in claim 6, wherein said doping impurity in said polycrystalline semiconductor material is boron.

11. A method as in claim 2, wherein said metal layer is of aluminum.

12. A method as claimed in claim 11, wherein said thickness of the provided aluminum layer is between 0.7 and 1.5 µm.

13. A method as in claim 2, wherein, prior to the formation of said at least one doped semiconductor zone in said monocrystalline semiconductor material, said polycrystalline semiconductor layer is provided in such a thickness that, after said diffusion at the area of said window, the quantity of doping impurity in said polycrystalline layer has decreased by at most three-fourths.

14. A method as in claim 2, wherein said layer of doped polycrystalline semiconductor material is deposited in a thickness which corresponds to at least one-fifth of the thickness of said doped semiconductor zone in the monocrystalline semiconductor material.

15. A method as in claim 2, wherein said doped polycrystalline semiconductor layer has a thickness of between 0.2 and 0.8 µm.

16. A method as in claim 15, wherein said layer of doped polycrystalline semiconductor material has a thickness of between 0.2 and 0.5 µm.

17. A method as in claim 2, wherein polycrystalline semiconductor layer is reduced in thickness to a thickness corresponding to 1 to 10 times the thickness of the part of the semiconductor material thereof which is dissolved in the metal layer upon forming the ohmic contact.

18. A method as in claim 2, wherein said polycrystalline semiconductor layer is reduced to a thickness between 0.03 and 0.2 μm.

19. A method as in claim 18, wherein the thickness of said polycrystalline semiconductor layer is reduced to between 0.05 and 0.15 μm.

20. A method as in claim 2, wherein said diffusion is carried out as that the thickness of said polycrystalline layer is reduced at least partly during the diffusion process.

21. A method as in claim 20, wherein the diffusion process is carried out in an oxidizing atmosphere.

22. A method as in claim 2, wherein the reduction in thickness of the polycrystalline semiconductor layer is carried out by etching after the diffusion process.

23. A method as in claim 2, wherein such reduction in thickness of the polycrystalline semiconductor layer after the diffusion process is carried out by erosion with a plasma in a diluted gas.

24. A method as in claim 2, wherein the reduction in thickness of the polycrystalline semiconductor layer after the diffusion process is carried out by anodic oxidation.

25. A method of manufacturing a semiconductor device comprising the steps of:

(a) providing a semiconductor body having a major surface and monocrystalline semiconductor material at said major surface, (b) providing on said monocrystalline material a protective insulation layer having therein at least one window which gives access to said monocrystalline semiconductor material, (c) deposited on said major surface accessible through said at least one window, a layer of polycrystalline semiconductor material which comprises a doping impurity, diffusing said doping impurity at said polycrystalline semiconductor layer at the area of said at least one window from said polycrystalline semicondutor into said monocrystalline semiconductor material so that at least one semiconductor zone doped with said diffused impurity is formed in said monocrystalline semiconductor material, (d) providing to said polycrystalline semiconductor layer a desired pattern which covers only part of said major surface and which covers entirely the portions of said monocrystalline semiconductor material exposed by said at least one window, (e) reducing the thickness of said polycrystalline semiconductor layer to a final thickness smaller than one fifth of the thickness of the hereinafter mentioned layer, and (f) then providing said at least one semiconductor zone with an ohmic contact comprising a metal layer which is provided on said reduced polycrystalline material in said window.

* * * * *